Figure 1:
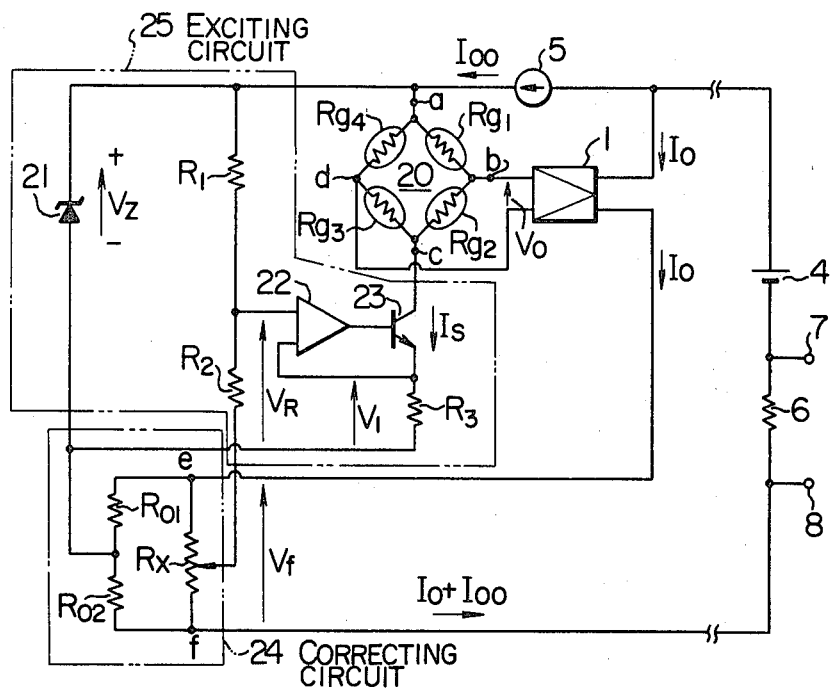

United States Patent [19]

Okayama et al.

[11] 4,362,060
[45] Dec. 7, 1982

[54] DISPLACEMENT TRANSDUCER

[75] Inventors: Tsutomu Okayama; Takashi Kugaya, both of Katsuta, Japan

[73] Assignee: Hitachi, Ltd., Tokyo, Japan

[21] Appl. No.: 195,108

[22] Filed: Oct. 8, 1980

[30] Foreign Application Priority Data

Oct. 8, 1979 [JP] Japan .................................. 54-128920

[51] Int. Cl.$^3$ ......................... G01L 9/06; G01L 19/04
[52] U.S. Cl. ....................................... 73/708; 73/721; 73/727; 73/862.63; 73/862.67
[58] Field of Search ................. 73/708, 721, 720, 726, 73/725, 765, 862.67, 862.63

[56] References Cited

U.S. PATENT DOCUMENTS

| | | | |
|---|---|---|---|
| 3,350,927 | 11/1967 | Senour | 73/765 |
| 4,000,643 | 1/1977 | Pearson | 73/708 |
| 4,071,823 | 1/1978 | Okayama | 324/65 R |
| 4,190,796 | 2/1980 | Ishii | 73/726 |
| 4,202,218 | 5/1980 | Romo | 73/708 |

Primary Examiner—Donald O. Woodiel

Attorney, Agent, or Firm—Antonelli, Terry and Wands

[57] ABSTRACT

A displacement transducer for measuring displacement brought about by pressure, strain or the like comprises a sensor for producing an electric signal representative of displacement, an output amplifier for amplifying the signal output from the sensor, an exciting circuit for exciting the sensor with a current or voltage and adapted for controlling excitation in dependence on deviation thereof from a reference value, and a correcting circuit for correcting the excitation of the sensor thereby to correct non-linearity of the output signal from the sensor. The correcting circuit includes a first voltage divider circuitry of a fixed dividing factor and a second voltage divider circuitry of a variable dividing factor connected in parallel with the first divider circuitry. The reference value is corrected by the voltage dividing factor of the second divider circuitry thereby to correct the excitation of the sensor. Correction of the non-linearity of the output signals of negative and positive polarities can be made with only a single correcting circuit.

15 Claims, 5 Drawing Figures

DISPLACEMENT TRANSDUCER

The present invention relates in general to a displacement transducer having a sensor adapted to respond to a mechanical displacement brought about by stress, pressure or strain, for example, and to produce an electric signal representative of the displacement. More particularly, the invention concerns an improvement on the displacement transducer in which the nonlinearity of the electric signal outputted from the sensor is corrected.

As a typical example of the sensor of the type stated above, there is a semiconductor sensor. Among others, the semiconductor sensor which is composed of a diaphragm of single crystal silicon having a surface with pressure-sensitive elements such as diffused monolithic gauge resistors is widely used. When the diaphragm of the semiconductor sensor is subjected to mechanical displacement due to stress, strain, distortion, or the like, the resistance values of the pressure-sensitive elements undergo variation because of the piezo-electric effect of the elements, whereby an electric signal representing proportionately the mechanical displacement is produced. As the displacement transducer incorporating the semiconductor sensor, there can be mentioned a two-wire type transmission circuit disclosed in U.S. Pat. No. 4,071,823. In the following, the description is mainly directed to the two-wire type transmission circuit.

The two-wire type transmission circuit is employed as the means for measuring pressure or differential pressure in various instrumentation systems and includes at the measuring side a sensor for producing a voltage signal proportional to a pressure or differential pressure to be measured, a constant-current circuit for supplying an exciting circuit for exciting the sensor with current or voltage and an output amplifier for amplifying the voltage signal output from the sensor and converting the voltage signal into a corresponding current signal which is then fed to a two-wire transmission line. On the other hand, the receiving circuit portion of the transmission circuit for receiving the measurement signal from the measuring circuit described above includes a series connection of a load resistor and a direct current (d.c.) power source which is connected to the two-wire transmission line.

The pressure-sensitive elements of the semi-conductor sensor are connected in a bridge circuit. Consequently, when the pressure-sensitive elements or the gauge resistor elements exhibit a non-linear characteristic, a non-linearity (more precisely, a signal component corresponding to a term proportional to a square of the measured quantity) will appear in the produced voltage signal as a function of variation in the quantity to be measured, which eventually involves error in the measurement, since the output signal from the semiconductor sensor is linearly amplified by the output amplifier and transmitted to the receiving circuitry.

An attempt for correcting the non-linearity of the output signal from the semiconductor sensor is proposed in Japanese Laid-Open Patent Application No. 149353/1978. According to the proposal, a correcting circuit adapted to define a given correcting constant is connected to the input of the output amplifier for determining a correcting voltage on the basis of the given correcting constant and the output signal from the semiconductor sensor, the correcting voltage thus derived being applied to the semiconductor sensor. However, this approach can correct the non-linearity of only one of the measurement signals of positive and negative polarities. Accordingly, two set of correcting circuits are required when the positive and negative non-linearities of the measurement signal are to be corrected.

An object of the present invention is to provide a displacement transducer which is capable of correcting the non-linearity of measurement signal of both negative and positive polarities with the aid of a single correcting circuit.

According to an aspect of the invention, a correcting circuit is constituted by a parallel connection of a first voltage divider circuitry having a fixed voltage dividing factor and a second voltage divider circuitry having a variable voltage dividing factor. The correcting circuit is provided at the output side of an output amplifier to thereby determine a reference value for excitation voltage or current for exciting the sensor on the basis of the output signal from the output amplifier, whereby the excitation of the sensor is controlled to be equal to the reference value. The reference value for the excitation is corrected by adjusting the dividing factor or ratio of the second voltage divider circuitry of the correcting circuit. With such circuit arrangement, it is possible to perform continuously correction of non-linearity of the measurement signal in both positive and negative regions by using a single correcting circuit.

The above and other objects, features and advantages of the invention will become more apparent from the following description of the preferred exemplary embodiments of the invention. The description makes reference to the drawings, in which:

FIG. 1 is a circuit diagram showing a displacement transducer for a two-wire type pressure transmission circuit according to an embodiment of the invention; and FIGS. 2 to 5 show other exemplary embodiments of the displacement transducer according to the invention.

Referring to FIG. 1 which shows an embodiment of the invention applied to a two-wire type pressure transmitter, electric power for the whole measuring circuit is supplied from a d.c. power supply source 4 provided at the side of a receiving circuit through a load resistor 6 and a transmission line.

In the measuring circuit portion, a constant-current circuit 5 is provided to supply a constant current to a sensor 20, an exciting circuit 25, a correcting circuit 24 and an output amplifier 1 independently from variation in voltage of the d.c. power supply source 4 and variation in the voltage drop produced across the load resistor 6.

The sensor 20 has a semiconductor strain gauge composed of a diaphragm of single crystal silicon which has pressure-sensitive elements $R_{g1}$, $R_{g2}$, $R_{g3}$ and $R_{g4}$ such as diffused monolithic gauge resistor elements. The pressure-sensitive elements $R_{g1}, \ldots, R_{g4}$ are connected in a bridge circuit which is excited by a current $I_S$ applied to the terminal c. A voltage signal $V_o$ representing proportionately the pressure to be measured makes appearance at output terminals b and d and is supplied to the output amplifier 1.

The exciting circuit 25 is constituted by a Zener diode 21 serving as a voltage stabilizing element for obtaining a constant voltage $V_Z$, a voltage divider circuit composed of resistor $R_1$ and $R_2$ for obtaining a reference value $V_R$ for the exciting current supplied to the sensor 20, a current detecting resistor $R_3$ for detecting a current $I_s$ flowing through the sensor 20, an operational amplifier 22 for controlling the exciting current supplied to the sensor 20 in accordance with deviation of the voltage $V_1$ appearing across the detecting resistor $R_3$ from the reference voltage $V_R$ (which is partially controlled by the correcting circuit 24) derived from the voltage divider resistor circuit ($R_1$; $R_2$), and a transistor 23 for controlling the current $I_S$ flowing through the sensor 20 in dependence on the output signal from the operational amplifier 22. The transistor 23 and the current detecting resistor $R_3$ are connected to the sensor 20 at the exit side of the excitation current. In this manner, the sensor 20 is excited by the current $I_S$ which is in proportion to the reference voltage $V_R$ determined by the exciting circuit 25 and the correcting circuit 24.

The correcting circuit 24 includes a first voltage divider circuitry having a fixed division factor determined by fixed resistor $R_{o1}$ and $R_{o2}$ and a second voltage divider circuitry having a variable voltage division factor determined by a variable resistor $R_X$. The first and the second voltage divider circuitries are connected in parallel to each other between terminals e and f. The terminal e of the correcting circuit 24 is connected to one of the output terminals of the output amplifier 1, while the terminal f is connected to the receiving circuit portion through a wire of a two-wire transmission line. The correcting circuit 24 serves to correct the non-linearity of the output signal from the output amplifier 1 by feeding back a part of the output current $I_o$ of the output amplifier 1 to the exciting circuit 25. To this end, the fixed voltage dividing point of the first voltage divider circuitry is connected to a junction between the Zener diode 21 and the detecting resistor $R_3$, while the variable voltage tap point of the second divider circuitry $R_X$ is connected to the resistor $R_2$, whereby a voltage $V_f$ proportional to the output voltage $V_o$ from the sensor 20 makes appearance between the terminals e and f. By adjusting the driving ratio of the second voltage divider circuitry to determine the feedback ratio of the voltage $V_f$ to the reference voltage $V_R$, the non-linearity of the output signal from the sensor 20 is corrected.

By the way, the Zener diode 21 of the exciting circuit 25 serves to stabilize those input signals which are supplied to the output amplifier 1, the exciting circuit 25, the sensor 20 and the correcting circuit 24, respectively, and additionally stabilize a driving power source (not shown) for the operational amplifier 22 and the output amplifier 1.

The output current $I_o$ amplified and converted through the output amplifier 1 from the output voltage of the sensor 20 which voltage has been corrected in respect of the non-linearity through operation of the correcting circuit 24 can be obtained from terminals 7 and 8 of the receiving load resistor 6 which forms a closed loop in cooperation with the output amplifier 1.

Next, correction of non-linearity performed by the circuit arrangement shown in FIG. 1 will be elucidated in detail.

Taking into consideration the non-linearity of the pressure vis. resistance characteristic of the pressure-sensitive elements $R_{g1}$, $R_{g2}$, $R_{g3}$ and $R_{g4}$, the voltage $V_f$ corresponding to the output voltage $V_o$ (unbalanced bridge voltage) of the sensor 20 can be expressed in terms of a function f(p) of pressure p and the exciting current $I_s$ for the sensor 20 as follows:

$$V_f = f(p) I_s \tag{1}$$

Further, the exciting circuit $I_s$ can be expressed in terms of the exciting current detecting resistor $R_3$ and the voltage $V_1$ appearing thereacross as follows:

$$I_s = V_1 / R_3 \tag{2}$$

In other words, the exciting current can be given by the following expression:

$$I_s = \frac{V_z R_2}{(R_1 + R_2) R_3} + x V_f \tag{3}$$

where $V_z$ represents the Zener voltage of the Zener diode 21, and x represents a variable which can be determined continuously over both the positive and negative ranges through settings of the variable resistor $R_x$ of the correcting circuit 24. The variable x corresponds to the feedback ratio of the voltage $V_f$ to the exciting current $I_s$. The variable x is zero, when the voltage divided by the fixed resistors $R_{o1}$ and $R_{o2}$ is equal to the divided voltage tapped from a movable terminal of the variable resistor $R_x$. When the movable terminal of the variable resistor $R_x$ is moved toward the terminal e, the value of x is increased. On the other hand, when the movable terminal is moved toward the terminal f, the value of x is decreased.

Assuming, simply, that the current flowing the correcting circuit 24 is only the current $I_o$ from the output amplifier 1, and current except the current $I_o$ is ignored, x is given as follows:

$$x = \frac{R_1}{(R_1 + R_2) R_3} \left( \frac{R_{o1}}{R_{o1} + R_{o2}} - y \right)$$

Where y is a dividing ratio of the second dividing circuit. When the movable terminal is moved from the terminal e to the terminal f, the y changes from 0 to 1.

From the expressions (1) and (3), the voltage $V_f$ which corresponds to the output voltage $V_o$ (unbalanced bridge voltage) from the sensor 20 can be expressed as follow:

$$I_o \propto V_f = \frac{V_z R_2}{(R_1 + R_2) R_3} \cdot \frac{f(p)}{1 - x \cdot f(p)} \tag{4}$$

$$\approx \frac{V_z R_2}{(R_1 + R_2) R_3} \{ f(p) + x \cdot f(p)^2 \} \tag{4'}$$

where $I_o$ represents the output current which is in proportion to the voltage $V_f$. As can be seen from the above expression (4'), the term of $f(p)^2$ can be varied arbitrarily by varying the value of x. The term f(p) comprises primarily terms p and $p^2$, wherein the term $p^2$ is of a smaller value than that of the term p. Accordingly, the term $p^2$ included in f(p) can be cancelled by the term $xp^2$ which is a main term of $x \cdot f(p)^2$.

As can be seen from above examination of the expression (4'), the relationship between the pressure p which is the quantity to be measured and the output current $I_o$ which corresponds to the output signal from the sensor 20 can be best approximated to a straight line in a concerned pressure range by selecting the variable x at the most appropriate value in the negative or positive range through setting of the variable resistor $R_x$ of the correcting circuit 24. In this connection, it is to be noted that the variable x takes a positive value when the positive non-linearity due to the negative value of the term $p^2$ of f(p) is to be corrected, while x takes a negative value for correction of the negative non-linearity due to the positive value of the term $p^2$ of f(p). The value of x is zero, when no correction of the non-linearity is required.

It will now be understood that the embodiment of the invention described above allows the positive and negative non-linearities of the output signal from the sensor 10 to be corrected continuously in a simplified manner by adjusting the single variable resistor element $R_x$ of the correcting circuit 24.

Figure 2:
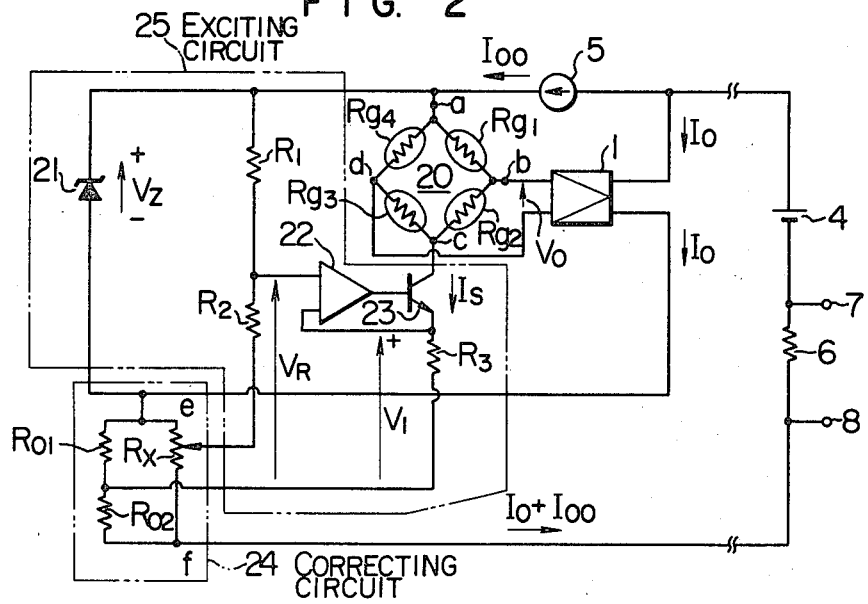

FIG. 2 shows another preferred embodiment of the invention which differs from the one shown in FIG. 1 in respect of the connection of the correcting circuit 24. More specifically, in the case of the circuit arrangement shown in FIG. 2, the connecting terminals of the Zener diode 21 are connected to the output terminals of the output amplifier 1 with a junction between the Zener diode 21 and one output terminal of the output amplifier 1 being connected to the terminal e of the correcting circuit 24, while the fixed voltage dividing point of the first voltage divider circuitry is connected to the exciting current detecting resistor $R_3$. With the circuit arrangement shown in FIG. 2, the range of positive values taken by the variable x of the expression (3) can be extended to thereby enlarge the range of the positive non-linearity to be corrected, when the circuit parameters are selected identical with those of the circuit shown in FIG. 1.

Figure 3:
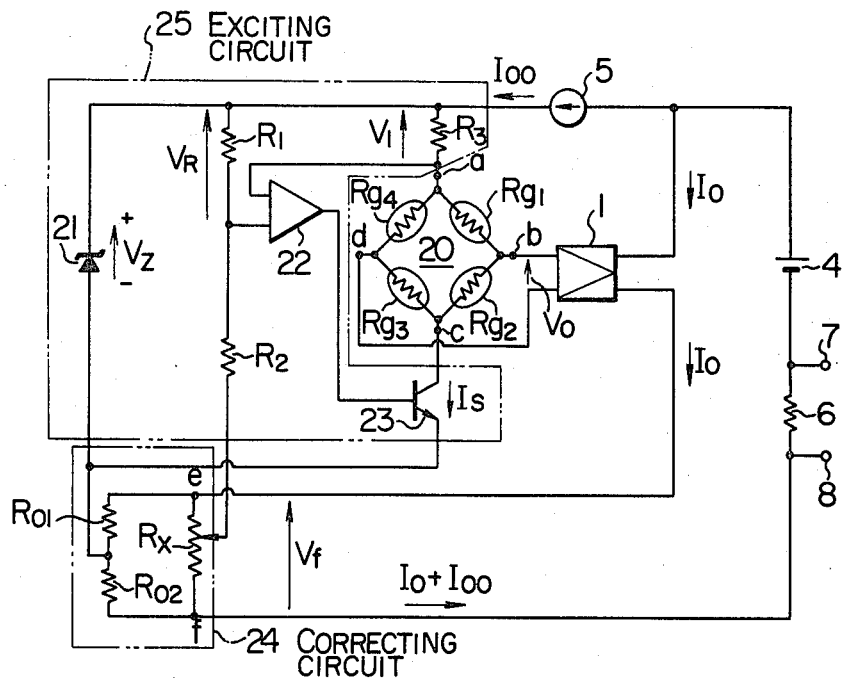
Figure 4:
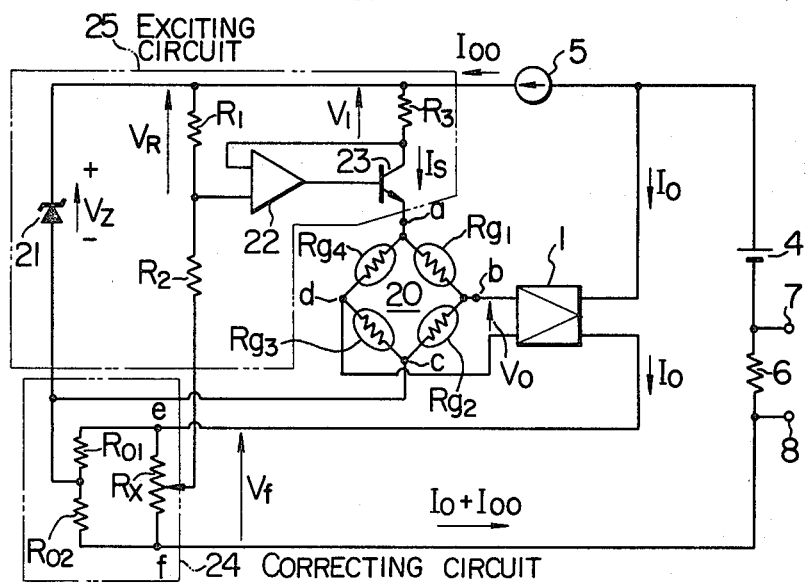

FIGS. 3 and 4 show further exemplary embodiments of the invention which differs from the one shown in FIG. 1 in respect of locations or positions of the current feeding terminal of the sensor 20 and the excitation current detecting resistor $R_3$ which take part in the excitation of the sensor 20. In the case of the circuit arrangements shown in FIGS. 3 and 4, the reference voltage $V_R$ is shifted by a predetermined voltage level. In respect of the means for generating the correcting term for the positive and negative non-linearities, the circuit arrangements shown in FIGS. 3 and 4 are same as the one shown in FIG. 1.

Figure 5:
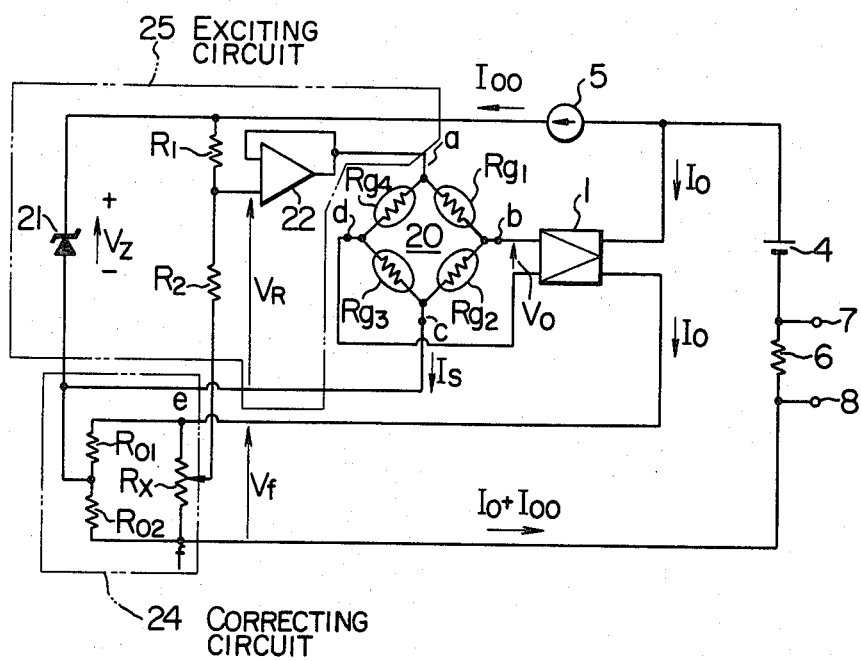

In the case of the embodiments described above in conjunction with FIGS. 1 to 4, the sensor 20 undergoes the current excitation by the exciting circuit 25. However, arrangement may be made such that the sensor 20 is voltage-excited, as is shown in FIG. 5.

Referring to this figure, the measuring circuit portion is constituted by an output amplifier 1 which forms a closed loop with the receiving circuit portion and serves to convert the voltage signal into an amplified current signal to be delivered to the transmission line, a sensor 20 having pressure-sensitive elements connected in a bridge circuit and adapted to produce an electric signal representing a displacement sensed by the pressure-sensitive elements, the electrical signal output from the sensor 20 being applied to the input of the output amplifier 1, a constant-current circuit 5 having one end connected to one of the output terminals of the output amplifier 1 and the other end connected to an exciting circuit 25 to control the exciting voltage for the sensor 20, and a correcting circuit 24 connected between the other output terminal of the output amplifier 1 and a wire of the two-wire transmission line and adapted to correct the non-linearity of the output signal from the sensor 20. The exciting circuit 25 comprises a voltage stabilizing element 21 having one end connected to the other end of the constant-current circuit 5 and the other end connected to the sensor 20 at the outgoing side of the exciting voltage, voltage dividing means composed of resistors $R_1$ and $R_2$ and having one end connected to one end of the voltage stabilizing element 21 for producing a reference value for the exciting voltage, and an operational amplifier 22 for controlling the exciting voltage in dependence on the output signal from the voltage dividing means ($R_1$; $R_2$). On the other hand, the correcting circuit 24 includes a first voltage dividing circuitry composed of a series connection of resistors $R_{01}$ and $R_{02}$ having respective fixed resistance values, and a second voltage dividing circuitry comprising a variable resistor $R_x$ so as to exhibit variable voltage dividing ratio. The first and second voltage dividing circuitries are connected in parallel with each other. The divided voltage tap point of the first voltage dividing circuitry is connected to the other end of the voltage stabilizing element 21, while the divided voltage tap point of the second voltage dividing circuitry is connected to the other end of the voltage dividing means ($R_1$; $R_2$) of the exciting circuit 25.

In the foregoing description, it has been assumed that the sensor is composed of pressure-sensitive elements connected in a bridge circuit. However, the invention can be easily applied also to the displacement transducer which makes use of a capacitance type sensor.

In the case of the illustrated embodiments, the voltage $V_f$ which is proportional to the sensor output signal is derived with the aid of the output current circuit of the transmitter. However, it will be a matter of design choice to utilize the output voltage from the output amplifier directly as the voltage $V_f$.

Thus, the circuit arrangement according to the invention can be employed as a non-linearity correcting circuit in more general sense to advantage.

Recently, many attempts have been made to reduce the non-linearity of detector element in the field of the sensor technology. Under the circumstances, the non-linear characteristic quantities tend to be dispersed concentratively in the vicinity of zero in both the negative and the positive regions. Thus, when the non-linearities in both the negative and the positive regions can be corrected continuously by means of one and the same circuit, not only the correcting manipulation becomes much facilitated, but also the circuit can be designed so that the absolute value of the non-linearity of the detecting or sensor element itself is minimized, whereby the magnitude of the quantity to be corrected can be significantly reduced, involving eventually a remarkably improved linearity after correction of the non-linearity in the positive or negative region.

As will be appreciated from the foregoing, the invention has proposed a displacement transducer whose non-linear characteristic in the negative and positive regions of the output signal can be corrected by using one and the same circuit of a simplified construction, whereby the correcting manipulation or adjustment can be efficiently carried out and at the same time the characteristic of the sensor can be significantly improved.

What is claimed is:

1. A displacement transducer for measuring displacement in a form of an electric signal, comprising a sensor for producing an electric signal in response to the displacement to be measured, an output amplifier for amplifying the electric signal output from said sensor, an exciting circuit for exciting said sensor with current or voltage and controlling the magnitude of excitation in accordance with deviation thereof from a reference value, and a correcting circuit connected to the output side of said output amplifier for correcting non-linearity of the output signal of said sensor, said correcting circuit including a first voltage dividing circuitry having a fixed voltage dividing factor and a second voltage dividing circuitry having a variable voltage dividing factor and connected in parallel to said first voltage dividing circuitry, wherein a voltage dividing point of said first voltage dividing circuitry is connected to a path for exciting said sensor, while a voltage dividing point of said second voltage dividing circuitry is connected to a circuit path for determining said reference value.

2. A displacement transducer according to claim 1, wherein said sensor includes pressure-sensitive elements connected in a bridge circuit, while said exciting circuit includes a transistor connected to said sensor for excitation with current and a detecting resistor connected to said sensor for detecting the exciting current, and an operational amplifier for controlling said transistor in dependence on difference between said exciting current detected by said detecting resistor and said reference value.

3. A displacement transducer according to claim 2, wherein said exciting circuit includes a voltage stabilizing element having one end connected to an exciting current feeding terminal of said sensor and the other end connected to the voltage dividing point of the first voltage dividing circuitry of said correcting circuit.

4. A displacement transducer according to claim 3, wherein said transistor and said detecting resistor connected to said sensor are disposed at the exciting current exit side of said sensor.

5. A displacement transducer according to claim 3, wherein said transistor and said detecting resistor connected to said sensor are disposed at the input side of said sensor for said exciting current.

6. A displacement transducer according to claim 3, wherein said transistor connected to said sensor is disposed at the exciting current exit side of said sensor, while said detecting resistor is disposed at the input side of said sensor for said exciting current.

7. A displacement transducer according to claim 2, wherein said exciting circuit includes a voltage stabilizing element having one end connected to an exciting current feeding terminal of said sensor and the other end connected to one of output terminals of said output amplifier.

8. A displacement transducer according to claim 1, wherein said sensor includes pressure-sensitive elements connected in a bridge circuit, and said exciting circuit is arranged to supply a voltage of said reference value as the exciting voltage to said sensor for exciting it with voltage.

9. A displacement transducer according to claim 1, wherein said correcting circuit is connected to said output amplifier and to said exciting circuit for correcting the non-linearity of the output signal of said output of said sensor of negative and positive polarities.

10. A displacement transducer according to claim 1, wherein said exciting circuit includes a voltage stabilizing element having one terminal connected to a supplying terminal for supplying the current or voltage to said sensor and having another terminal connected to said correcting circuit.

11. A displacement transducer according to claim 10, wherein said another terminal of said voltage stabilizing element is connected to the voltage dividing point of said first voltage dividing circuitry.

12. A displacement transducer for measuring displacement brought about by pressure, strain or the like in a form of an electrical signal which is then transmitted to a receiving side through a two-wire type transmission line, including a receiving circuit composed of a series connection of a d.c. power supply source and a load resistor, and a measuring circuit connected to said receiving circuit through the two-wire type transmission line, said measuring circuit comprising an output amplifier constituting a closed loop in cooperation with said receiving circuit and adapted to convert a voltage signal to an amplified current signal which is then output to said transmission line, a sensor including pressure-sensitive elements connected in a bridge circuit and adapted to produce an electrical signal in dependence on said displacement, said electrical signal being applied to said output amplifier, a constant-current circuit having one end connected to one of output terminals of said output amplifier and the other end connected to an exciting circuit adapted to control an exciting current fed to said sensor, said exciting circuit including a transistor and a detecting resistor connected to said sensor, said resistor serving the detect the exciting current, a voltage stabilizing element having one end connected to the other end of said constant current circuit, voltage dividing means having one end connected to one end of said voltage stabilizing element for obtaining a reference value for the exciting current of said sensor, and an operational amplifier for controlling said transistor in accordance with deviation between said reference value and a value detected by said detecting resistor, said displacement transducer further comprising a correcting circuit inserted between the other output terminal of said output amplifier and one wire of said two-wire type transmission line for correcting non-linearity of the output signal from said sensor, said correcting circuit including a first voltage dividing circuitry having a fixed voltage dividing factor and a second voltage dividing circuitry having a variable voltage dividing factor and connected in parallel with said first voltage dividing circuitry, the voltage dividing point of said first voltage dividing circuitry being connected to a path along which the current for exciting said sensor flows, while the voltage dividing point of said second voltage dividing circuitry is connected to the other end of said voltage dividing means.

13. A displacement transducer according to claim 12, wherein the other end of said voltage stabilizing element of said exciting circuit is connected to the voltage dividing point of said first voltage dividing circuitry.

14. A displacement transducer according to claim 12, wherein the other end of said voltage stabilizing element of said exciting circuit is connected to the other output terminal of said output amplifier.

15. A displacement transducer for measuring displacement brought about by pressure and strain in a form of an electrical signal which is then transmitted to a receiving circuit through a two-wire type transmission line, comprising a series connection of a d.c. power supply source and a load resistor which constitute said receiving circuit, and a measuring circuit;

said measuring circuit including an output amplifier forming a closed loop in cooperation with said receiving circuit and serving for converting a voltage signal into an amplified current signal to be output to said transmission line, a sensor having pressure sensitive elements connected in a bridge circuit and adapted to produce an electrical signal representative of said displacement, said electrical signal being applied to said output amplifier, a constant-current circuit having one end connected to one of the output terminals of said output amplifier and the other end connected to an exciting circuit for controlling an exciting voltage for said sensor, and a correcting circuit inserted between the other output terminal of said output amplifier and a wire of said two-wire type transmission line and serving to correct non-linearity of the output signal from said sensor;

said exciting circuit including a voltage stabilizing element having one end connected to the other end of said constant-current circuit and the other end connected to said sensor at the exit side of said exciting voltage, voltage dividing means having one end connected to one end of said voltage stabilizing element for obtaining a reference value for said exciting voltage, and an operational amplifier for controlling said exciting voltage in dependence on the output signal from said voltage dividing means;

said correcting circuit including a first voltage dividing circuitry having a fixed voltage dividing factor, and a second voltage dividing circuitry having a variable voltage dividing factor and connected in parallel with said first voltage dividing circuitry, wherein a voltage dividing point of said first voltage dividing circuitry connected to the other end of said voltage stabilizing element, while a voltage dividing point of said second voltage dividing circuitry is connected to the other end of said voltage dividing means of said exciting circuit.

* * * * *